(12) United States Patent
Palmer et al.

(10) Patent No.: US 11,677,391 B1
(45) Date of Patent: Jun. 13, 2023

(54) LOW-POWER MULTI-DOMAIN SYNCHRONIZER

(71) Applicant: Rambus Inc., San Jose, CA (US)

(72) Inventors: Robert E. Palmer, Chapel Hill, NC (US); Andrew M. Fuller, Durham, NC (US); William F. Stonecypher, Chapel Hill, NC (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 17/585,297

(22) Filed: Jan. 26, 2022

Related U.S. Application Data

(60) Provisional application No. 63/142,947, filed on Jan. 28, 2021.

(51) Int. Cl.
*H03K 5/01* (2006.01)
*G06F 1/12* (2006.01)
*H03K 5/00* (2006.01)

(52) U.S. Cl.
CPC .............. *H03K 5/01* (2013.01); *G06F 1/12* (2013.01); *H03K 2005/00019* (2013.01)

(58) Field of Classification Search
CPC ... H03K 5/01; H03K 2005/00019; G06F 1/12
USPC ....................................................... 327/161
See application file for complete search history.

(56) References Cited

U.S. PATENT DOCUMENTS

| | | | | |
|---|---|---|---|---|
| 6,396,887 | B1* | 5/2002 | Ware | G06F 1/12 327/144 |
| 6,473,439 | B1* | 10/2002 | Zerbe | H04L 7/0012 713/400 |
| 8,826,057 | B1* | 9/2014 | Chin | G06F 13/4054 713/400 |
| 9,304,530 | B1* | 4/2016 | Ware | G06F 1/04 |
| 9,449,662 | B1* | 9/2016 | Kwak | G11C 7/1093 |
| 2005/0105377 | A1* | 5/2005 | Kim | G11C 29/842 365/233.1 |
| 2006/0152467 | A1* | 7/2006 | Lee | H03K 19/0005 377/64 |
| 2006/0291302 | A1* | 12/2006 | Seto | G11C 7/1066 365/193 |
| 2010/0056066 | A1* | 3/2010 | Shin | G11C 7/1078 455/68 |
| 2014/0002149 | A1* | 1/2014 | Jang | H03L 7/0816 327/158 |
| 2014/0010029 | A1* | 1/2014 | Jung | G11C 7/222 365/194 |
| 2022/0124655 | A1* | 4/2022 | Liu | H04J 3/0685 |

* cited by examiner

*Primary Examiner* — Ryan Jager
(74) *Attorney, Agent, or Firm* — Charles Shemwell

(57) ABSTRACT

A latency controller within an integrated circuit device retimes command-stream-triggered control and timing signals into endpoint timing domains having respective time-varying phase offsets relative to a reference clock by iteratively estimating and logging the phase offsets independently of commands streaming into the integrated circuit device.

21 Claims, 6 Drawing Sheets

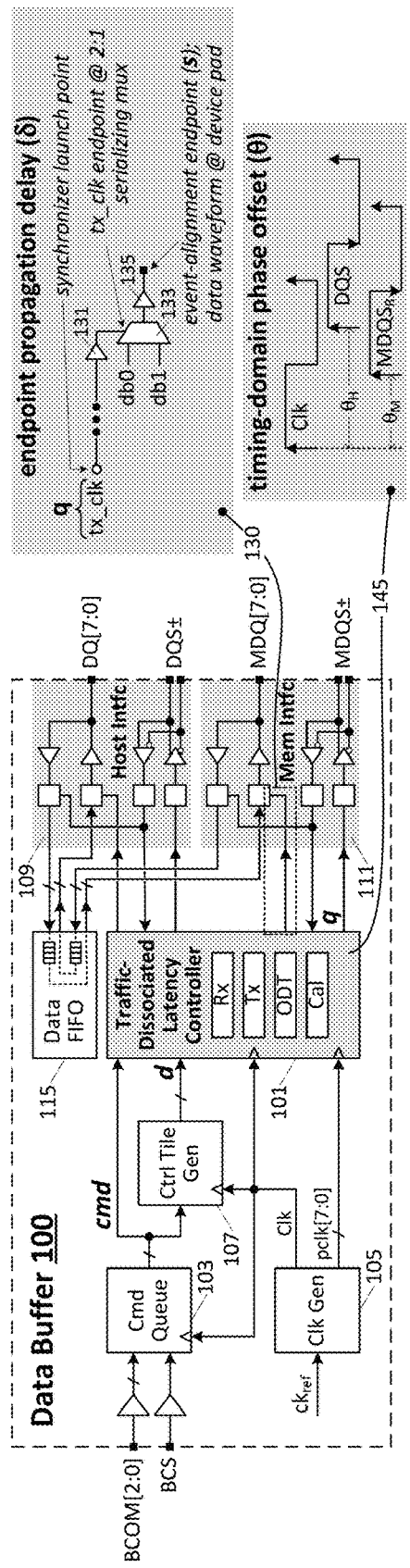
Fig. 1
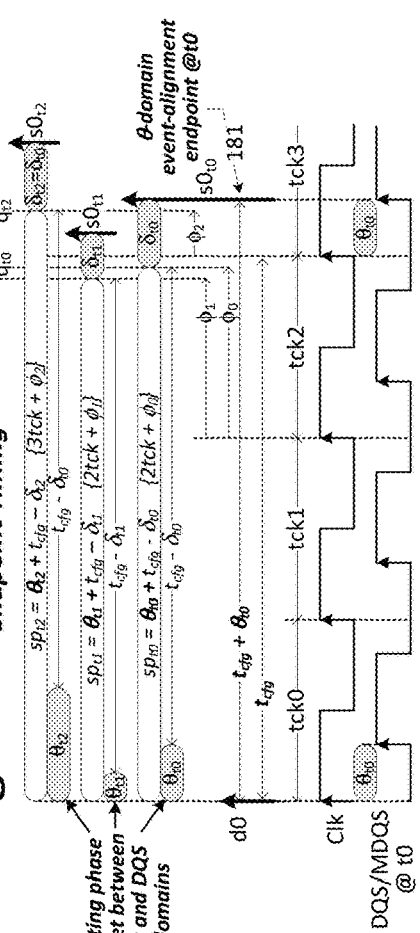
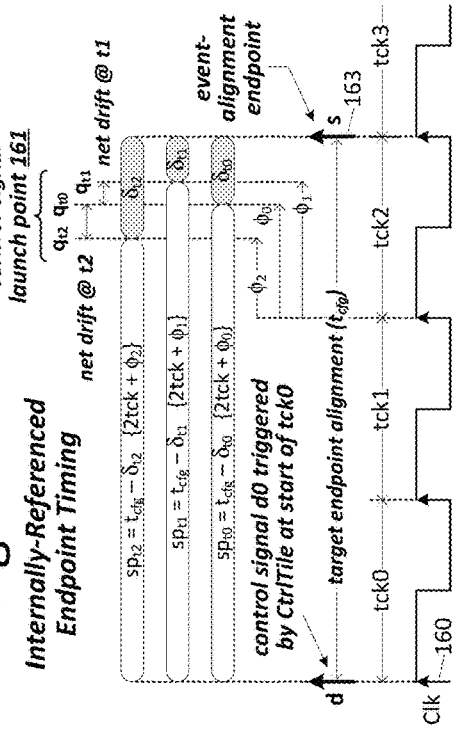
Fig. 3 Externally-Referenced Endpoint Timing
Fig. 2 Internally-Referenced Endpoint Timing

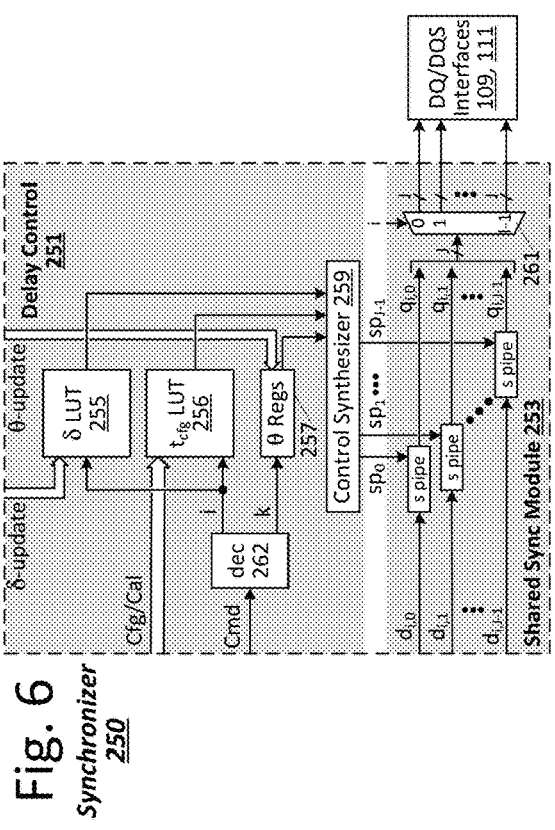
Fig. 6 Synchronizer 250
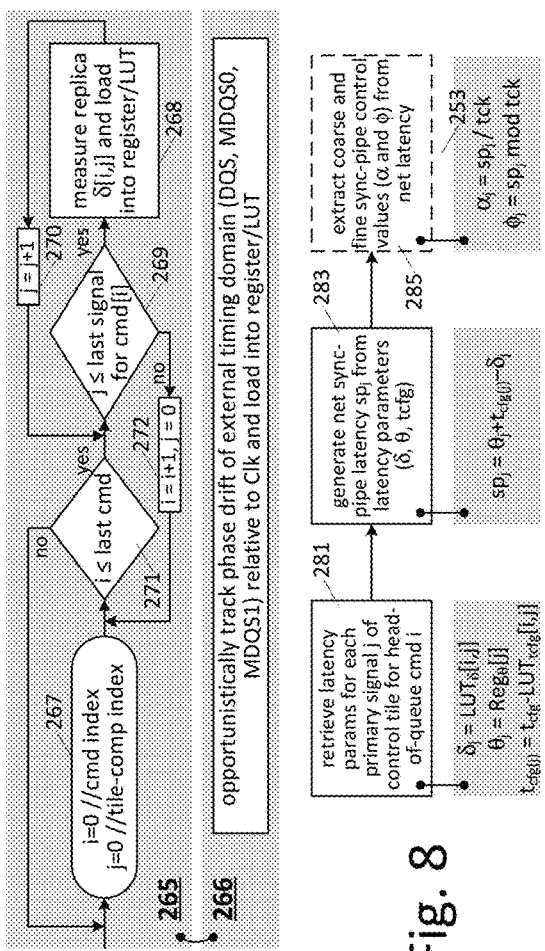
Fig. 7
Fig. 8
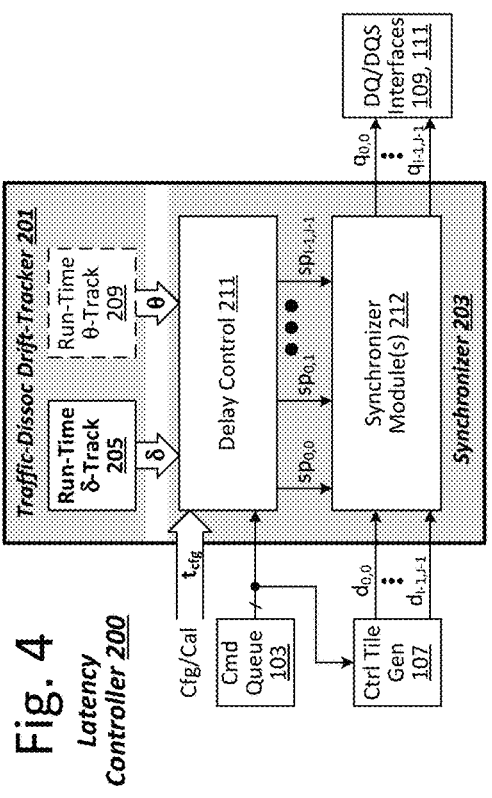
Fig. 4 Latency Controller 200
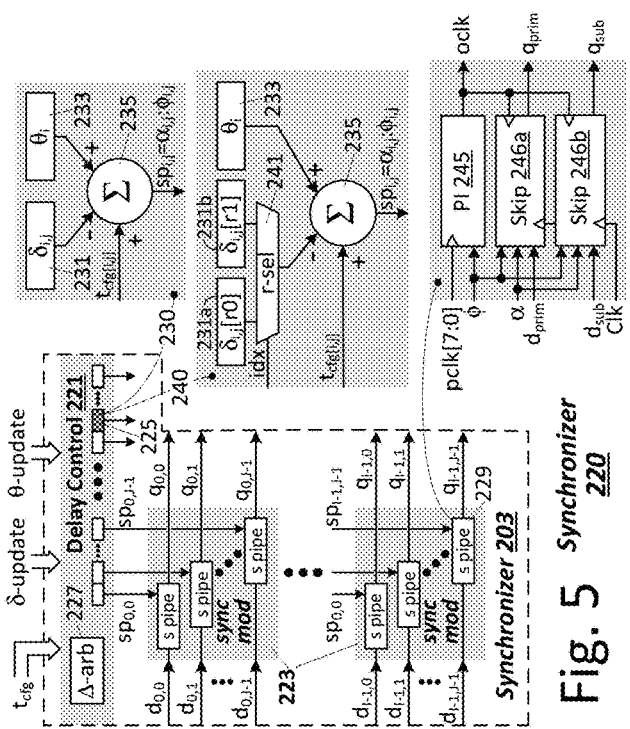
Fig. 5 Synchronizer 220

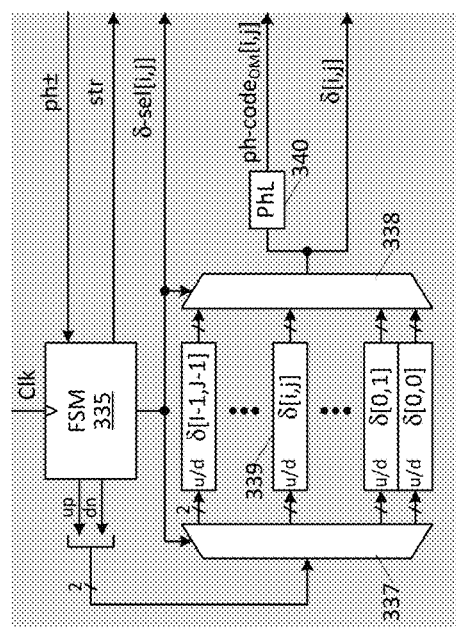
Fig. 10 Measurement Controller
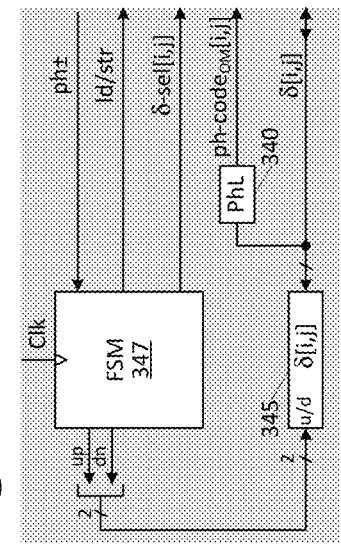
Fig. 11 Measurement Controller
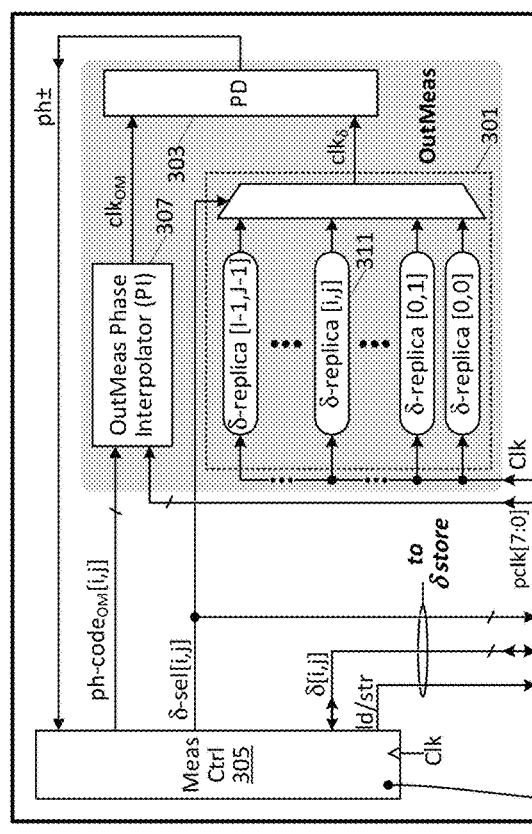
Fig. 9 Run-Time δTrack

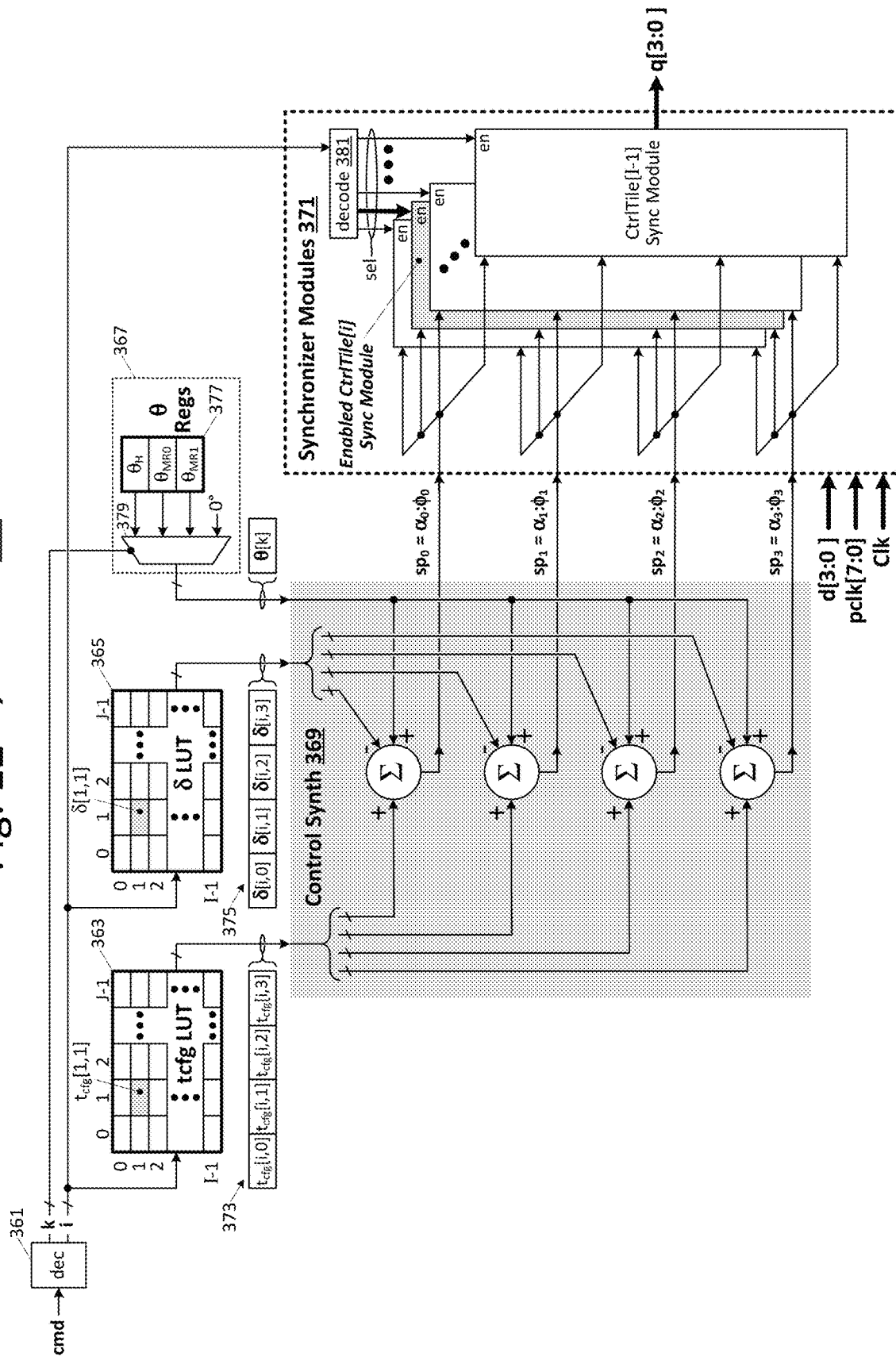
Fig. 12 Synchronizer 360

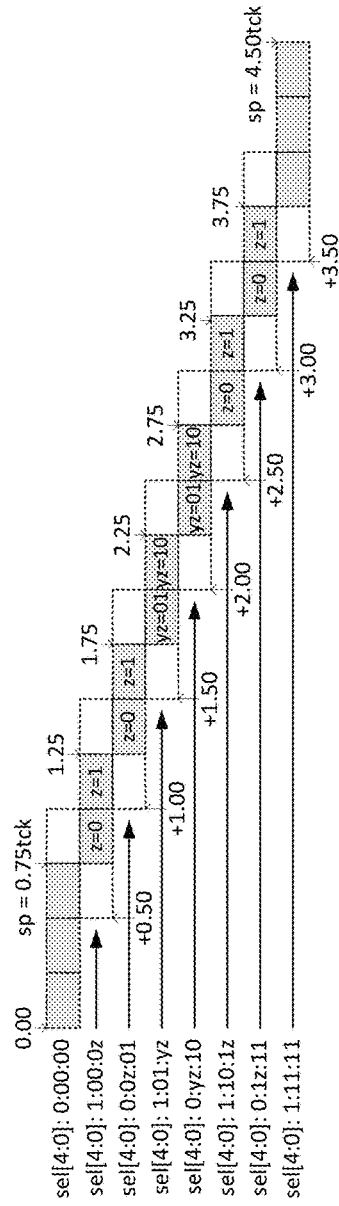
Fig. 14 *skip-control LUT*
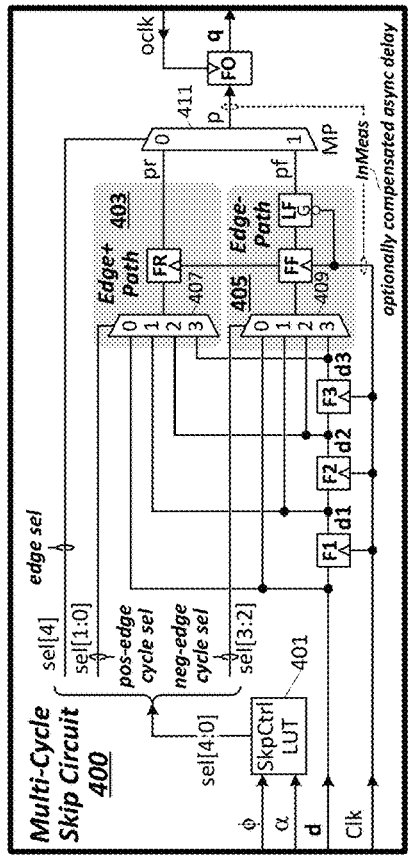
Fig. 13
Fig. 15

Run-Time δTrack,
OutMeas + InMeas

LOW-POWER MULTI-DOMAIN SYNCHRONIZER

CROSS REFERENCE TO RELATED APPLICATIONS

This application hereby incorporates by reference and claims the filing-date benefit of U.S. Provisional Application No. 63/142,947 filed Jan. 28, 2021.

DRAWINGS

The various embodiments disclosed herein are illustrated by way of example, and not by way of limitation, in the figures of the accompanying drawings and in which like reference numerals refer to similar elements and in which:

FIG. 1 illustrates an embodiment of an integrated-circuit data buffer having a traffic-dissociated latency controller that implements out-of-band endpoint latency estimation to retime command-triggered control and timing signals into end-point timing domains;

FIGS. 2 and 3 illustrate exemplary time-varying control signal propagation delays implemented by the FIG. 1 latency controller to yield internally-referenced and externally-referenced endpoint-event alignments;

FIG. 4 illustrates exemplary drift-tracking and synchronizer engines within a more detailed embodiment of the FIG. 1 latency controller;

FIG. 5 illustrates an embodiment of a synchronizer that may implement the synchronizer engine of FIG. 4;

FIG. 6 illustrates an alternative synchronizer embodiment that may implement the synchronizer engine of FIG. 4;

FIG. 7 illustrates exemplary and parallel δ-delay tracking and θ-tracking operations implemented within the δ-tracker and θ-tracker of FIG. 4;

FIG. 8 illustrates exemplary generation of delay-path controls (synchronizer-pipe control values) for command-triggered control signals;

FIG. 9 illustrates an embodiment of a run-time δ-tracking engine that may implement the delay-tracking engine of FIG. 4;

FIG. 10 illustrates an embodiment of the FIG. 9 measurement controller;

FIG. 11 illustrates an alternative embodiment of the FIG. 9 measurement controller;

FIG. 12 illustrates a more detailed embodiment of delay-lookup synchronizer;

FIG. 13 illustrates an embodiment of a multi-cycle skip circuit that may be deployed within individual synchronizer pipes;

FIG. 14 illustrates an exemplary storage of skip-circuit control codes within the skip-control lookup table of FIG. 13;

FIG. 15 illustrates the bit transitions within the exemplary skip-circuit control code sequence discussed in reference to FIGS. 9-11;

DETAILED DESCRIPTION

Figure 16:
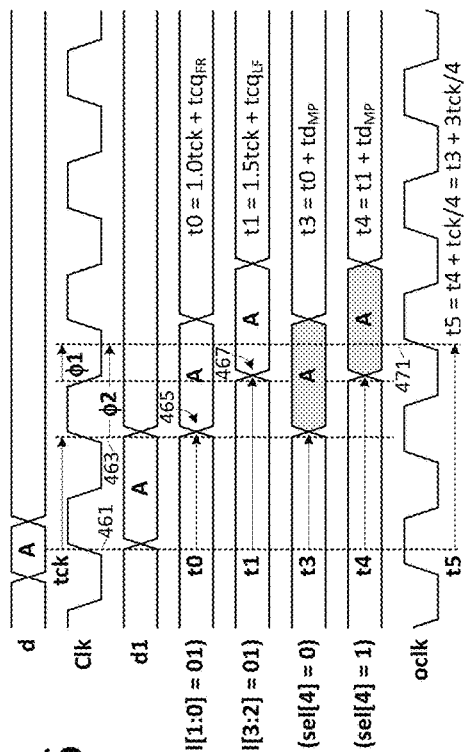
FIG. 16 illustrates exemplary signal waveforms within the glitchless multi-cycle skip circuit of FIG. 13.

In various embodiments disclosed herein, a latency controller within an integrated circuit device retimes command-stream-triggered control and timing signals into endpoint timing domains having respective time-varying phase offsets relative to a reference clock by iteratively estimating and logging the phase offsets independently of commands streaming into the integrated circuit device. To generate control/timing signals demanded by a given command within the command stream, the latency controller applies the phase-offset estimates within a multi-cycle skip circuit and clock-phase interpolator to align control signal and timing signal transitions with their respective endpoint timing domains. In a number of embodiments the multi-cycle skip circuit includes parallel signal propagation paths that are alternately selected, according to the net phase delay to be implemented within the synchronizer for a given control/timing signal, to produce the skip circuit output—an approach that enables the unselected path to be reconfigured (in accordance with the net phase delay to make ready for instantaneous propagation-path switchover) without disrupting or glitching active signal propagation through the skip circuit. These and other features and embodiments are discussed in further detail below.

FIG. 1 illustrates an embodiment of an integrated-circuit data buffer 100 having a traffic-dissociated latency controller 101 that implements out-of-band endpoint latency estimation to retime command-triggered control and timing signals (collectively referred to herein as control signals) into end-point timing domains. In the depicted example, data-forwarding commands received via a multi-bit buffer-command bus (i.e., received via BCOM[2:0] when buffer-chip-select signal BCS is asserted) are sequentially clocked into and through a command queue 103 to form, at the output of the command queue, a stream of commands for which respective sets of command-implementing control and/or timing signals (collectively, "control signals") are to be generated. The command at the head of the command queue during a given clock cycle (i.e., "tck" interval, the cycle time of a device-internal clock signal "Clk" generated by clock generator 105 in response to reference clock, $ck_{ref}$) is supplied to a control tile generator 107 and to traffic-dissociated latency controller 101, the former to assert, on respective signal lines, the various control signals (shown collectively as 'd') needed to carry out the transaction indicated by the head-of-queue command and the latter to produce instances ('q') of those control signals selectively-delayed (retimed) to arrive at respective control/timing destinations within or external to the data buffer IC with a desired net phase offset relative to the device clock (Clk).

In the FIG. 1 example, the various retimed control/timing signals ('q') output from latency controller 101 are supplied to strobe-synchronous host and memory data interfaces 109, 111 to implement data forwarding operations through a data FIFO 115 (first-in-first-out buffer or queue)—forwarding write data from a host controller ("host") to a memory device within a selected one of multiple memory ranks, and forwarding read data from a selected-rank memory device to the host controller. In a write data forwarding operation, latency controller outputs various precisely retimed control signals to enable write data reception via host interface 109 and counterpart write data transmission via memory interface 111. Ditto for read data forwarding, but with data reception via memory interface 111 and data transmission via host interface 109. More specifically, during data reception, latency controller 101 asserts (in response to a corresponding control signal 'd' from control-tile generator 107) a strobe-gate signal (an example of a retimed signal 'q') at an appropriate timing point in the preamble of each inbound data strobe DQS/MDQS (there may be a separate strobe signal for each 4-bit nibble of the 8-bit DQ/MDQ paths) to produce a gated strobe signal that, in turn, clocks data reception and loading into data FIFO 115. During the ensuing data transmission (i.e., after data is unloaded from FIFO 115 at edges of the device clock to effect a strobe-to-Clk domain crossing), latency controller 101 retimes a transmit clock signal as necessary to align an outbound data burst (sequence of data symbols)—at the external contacts of the memory interface—with specific device clock edges. More specifically, the transmit-clock is conveyed from its launch point at the output of latency controller 101 (i.e., another example of a selectively-delayed control/timing signal 'q') to its control destination or endpoint at a serializing multiplexer as shown in detail view 130, flowing, in this example through buffer element 131 (e.g., clock-tree to fan-out the transmit clock to multiple transmitter instances of serializing multiplexer 133/output driver 135). As propagation delays through buffer 131, multiplexer 133 and any other in-path circuitry will contribute to delay between an edge of the transmit-clock at the launch instant (i.e., signal instance 'q') and a corresponding edge of a data eye at the output of multiplexer 133, and propagation of the data eye through output driver 135 to the device pad (external contact of data buffer IC—in this case an MDQ contact) will contribute further delay, the latency controller must launch the transmit clock at some point in time set by the timing of the desired endpoint event (data symbol at device pad in this example) minus the sum total of delays between the launch instant (assertion of q) and that alignment event. As a matter of terminology, the node at which a given control signal is applied (which may include multiple nodes within a locality) is referred to herein as the control endpoint, the node at which a given event is to be aligned with a target or ideal latency (generally specified in whole or half tck intervals in the depicted embodiment, with some fractional-offset exceptions such as MDQS output in quadrature (quarter-tck) phase shift relative to the corresponding write data burst) is referred to as the event-alignment endpoint, and the latency controller node from which retimed control signal (q) is output is referred to as the launch point (signal 'q' being launched from that point at a "launch instant"). Additionally, constituent control/timing signals of a given control tile may have correlated endpoint event alignment (i.e., same endpoint event alignment or respective endpoint event alignments with fixed full-cycle or fractional-cycle phase offsets) so that one "lead" or primary signal within a group of such endpoint-correlated signals may be drift-tracked, while the remaining "subordinate" or secondary signals in the group inherit drift compensation applied to the primary signal—for example, subject to same drift-compensated propagation delay through the latency controller. Note that the transmit clock shown in detail view 130 is but one example of various control/timing signals output by latency controller 101 to the host and memory data interfaces, all or any subset of which may be characterized by control endpoint, event-alignment endpoint, launch instant and hierarchical status as a primary or subordinate signal within a signal group. Other signals include, for example and without limitation, aforementioned strobe-gate signals to gate preamble and/or postamble edges out of inbound strobe signals (DQS, MDQS) in connection with data receive operations (RX), strobe-transmit signals to enable generation of outbound DQS and MDQS signals (part of TX), various calibration control signals (CAL), on-die-termination signals (ODT) to selectively apply termination impedances within host and memory interfaces 109, 111 (local ODT) as well as remote interfaces, for example, within attached memory devices (remote ODT), the latter including dynamic ODT controls where the impedance applied to terminate a given data line (DQ) is transitioned between different values at respective timing points in relation to a data burst conveyed on that line, etc. In some instances, the control endpoint and event-alignment endpoints are at nodes within the data buffer IC (those nodes including contact pads). In others (e.g., ODT signals, memory-side data and strobe signals), control and/or event-alignment endpoints may be outside the data buffer IC as, for example, where the desired timing alignment relates to events within an attached memory component or host controller.

In general, delay between control signal launch at the latency controller (q) and the corresponding event-alignment endpoint (i.e., as indicated by signal 's')—an asynchronous time interval referred to herein as endpoint propagation delay, $\delta$—is subject to process-dependent drift with changing voltage and temperature (PVT drift). In contrast to legacy drift-tracking approaches that require a distinct closed-loop drift-tracking circuit to compensate each asynchronous delay and/or implement such closed-loop drift-tracking circuits in the path between source signal and delayed output signal (e.g., drift-tracking circuit clocks the source signal through the delay circuit), traffic-dissociated latency controller 101 tracks all time-varying endpoint propagation delays within a single closed-loop delay estimation circuit (or at least fewer closed loop circuits than the number of independent endpoint propagation delays to be tracked) that operates independently of both the d-to-q delay path through the latency controller and the incoming stream of commands—for example, providing no clock signals to the synchronizer circuitry that implements the d-to-q delay path.

In addition to the various time-drifting endpoint propagation delays, some control signals may require phase shift into host or memory timing domains. Memory-side strobe-gate signals, for example, are endpoint-event aligned with respect to incoming MDQS edges so that any phase offset, $\theta$, between the device clock domain (to which the strobe-gate signals are aligned as signals 'd' at the control-tile input to latency controller 101) and the timing domains represented by incoming strobe signals may be compensated by the latency controller. In some cases, the device clock may be aligned to one or all of the externally controlled timing domains (e.g., aligning Clk to the memory-side strobe domain (MDQS) during initialization of the data buffer IC, with memory-side training and drift-tracking to maintain respective MDQS timing domains for each memory rank in alignment with Clk) so that $\theta$ may be zero with respect to one or more (or all) external timing domains and thus require no compensation within latency controller. In the more general case (which may apply, for example, in low power memory installations that lack onboard timing compensation circuitry such that rank-specific MDQS domains drift relative to the DQS domain and/or where the device clock domain is not maintained in alignment with any external domain), the timing-domain phase offset between the device clock domain (Clk) and various incoming strobe domains (i.e., shown within detail view 145 as $\theta_H$ between Clk and DQS, and as $\theta_M$ between Clk and the strobe domain $MDQS_R$ for a given memory rank, R) is tracked and compensated for control signals having externally-referenced endpoint-event alignment. In a number of embodiments, an externally-referenced endpoint event alignment may be established (calibrated) once during initialization, with on-chip PVT variation compensated thereafter.

FIGS. 2 and 3 illustrate exemplary time-varying control signal propagation delays implemented by the FIG. 1 latency controller to yield internally-referenced (i.e., referenced to device clock, Clk) and externally-referenced (e.g., to DQS or $MDQS_R$) endpoint-event alignments, respectively. In the internally-referenced endpoint alignment shown in FIG. 2, the latency controller imposes a time-varying synchronization delay—from control-tile signal input 'd' at clock edge 160 to corresponding signal launch 'q' at the latency controller output (161)—so as to yield a steady-state endpoint-event alignment 's' (163). In the depicted example, the net delay from latency controller input to event-alignment instant (d-to-s) is specified by a latency-configuration parameter, $t_{cfg}$, for the relevant control signal programmed, for example, within a configuration register and/or lookup table component of the data buffer IC. At initialization (or reset or other strategic time), the latency controller determines an initial endpoint propagation delay, $\delta_{r0}$ (i.e., time delay between control signal launch '$q_{r0}$' at the latency controller output and endpoint-event alignment 163) and applies that endpoint propagation delay together with the specified end-to-end latency target ($t_{cfg}$) to determine the net d-to-q delay ("synchronizer delay") to be imposed by the latency controller to yield the endpoint-event alignment. More specifically, the latency controller backs the endpoint propagation delay out of the end-to-end latency target ($t_{cfg}$–$\delta_{r0}$) to yield, at a given time t0, a "sync-pipe" latency control value ($sp_{r0}$) and applies that latency control value to a variable-delay "synchronization pipeline" circuit ("sync pipe") dedicated or allocated to the subject control signal to implement the exact 'q' signal launch timing needed to maintain the configuration-specified endpoint alignment. Thereafter, the latency controller iteratively tracks the endpoint propagation delay over time, increasing and decreasing the sync pipe control value (and thus the sync pipe propagation delay) as necessary to compensate for δ drift (e.g., process-dependent drift due to changes in voltage and temperature) —moving the control signal launch point (as shown at $q_{r1}$ and $q_{r2}$ for progressively later times t1 and t2) so as to maintain the target endpoint alignment. While the FIG. 2 example depicts a whole-cycle event alignment, internally-referenced endpoint timing may have a fractional-cycle component.

In the externally-referenced endpoint alignment of FIG. 3, the latency controller implements the same δ-drift compensation discussed above, and additionally compensates for time-varying drift between the internal and external timing domains (i.e., drift between Clk and DQS/MDQS). More specifically, because the event-alignment endpoint is fixed relative to an external timing domain that drifts relative to the data buffer's internal clock, the alignment endpoint itself drifts relative to the device clock domain (Clk) and thus occurs at $t_{cfg}$ (the target end-to-end timing from 'd' to 's') plus the interdomain phase offset θ; initially at $t_{cfg}+\theta_{r0}$ as shown at 181. Accordingly, the latency controller sets the sync pipe control value to both advance the q signal launch point to compensate for the endpoint propagation delay ($t_{cfg}$–δ) and delay the q signal launch point to compensate for the interdomain phase offset and thus, at any given time, $t_n$, to $sp_{tn}=\delta_{tn}+t_{cfg}-\delta_{tn}$.

In both the FIG. 2 and FIG. 3 timing scenarios, the sync pipe latency for a given control signal (i.e., as specified by sync control value 'sp') may span an integer number of clock cycles (α) plus a sub-cycle phase angle, φ, the latter ranging between 0 and 360° (i.e., from $i*360°/2^m$, where i=0 to $2^m-1$, and m is the bit depth of a digital representation of φ). In embodiments discussed below, integer delay steps are implemented by a multi-cycle skip circuit, while the fractional-cycle phase offset is implemented within a corresponding phase interpolator that retimes the skip circuit output into the desired output clock phase—a given sync pipe including one or more of the skip circuits (for primary and any subordinate signals) and corresponding phase interpolator.

To maximize the delay tolerance within an actualized skip circuit (i.e., having a finite delay-selection range), the various sync pipe delays may be tck-leveled within the command queue and/or control-tile generator (elements 103 and 107 of FIG. 1). In a number of implementations, for example, the command queue compensates for some number of whole tck intervals so as to center the nominal skip circuit delay at the midpoint within the sync pipe delay range. Assuming, for example, a sync pipe having a 4 tck delay compensation range (i.e., capable of delaying the launch point of signal 'q' by 0 to 4 tck intervals relative to Clk-aligned input signal 'd') and control signals having respective nominal output latencies of 4 tck and 5 tck, the command queue may be configured (programmed) to impose a 2 tck delay in d0 (i.e., delaying delivery of d0 to the latency controller by 2 tck) and a 3 tck delay in d1 to nominally center the synchronization delay (d-to-q delay to be imposed by the latency controller) at the midpoint of the four-cycle sync pipe delay range (i.e., enabling ±2 tck endpoint delay drift relative to the nominal midpoint).

In a number of embodiments the FIG. 1 command queue (103) decomposes each incoming data-forwarding command into a pair (or set) of command-primitives corresponding to operations required within respective host and memory interfaces, queuing those command-primitives to yield, at appropriate times marked by their separate progressions through the command queue, corresponding control tile generation and signal-delay imposition within traffic-dissociated latency controller 101. For example, the command queue may decompose an incoming write-data-forwarding command into corresponding write-data reception and write data transmission command-primitives, generating control tiles for those two operations (one devoted to data reception within host interface 109 and the other to data transmission via memory interface 111) at respective times as each command-primitive progresses to the head of the command queue. Ditto for a read-data command—decomposed into corresponding read-data reception and read-data transmission command-primitives. In general, the FIG. 1 control tile generator (107) responds to each different type of command-primitive by asserting, at the input of latency controller 101, one or more primary control signals 'd' that propagate through respective sync pipes within the latency controller, with subordinate control signals, if any, propagating through a subordinate skip-circuit within the primary-signal sync pipe. In one embodiment, latency controller 101 includes a respective synchronizer "module" for each distinct command-primitive and, within each synchronizer module, a respective sync pipe for each endpoint-aligned set of component control signals 'd' (i.e., primary control signal and any subordinate signals) of the control tile for that command-primitive. Thus, each primary control signal 'd' and its associated endpoint delay (δ), latency configuration ($t_{cfg}$), synchronized output instance 'q' may be conceptually indexed by a command-primitive index 'i' (where i ranges from 0 to the number of distinct command-primitives, I−1) and control-tile component index 'j' (where j ranges from 0 to the number of primary signals J−1 of a given control tile, and where J may vary from one type of control type to the next). While this notation and synchronizer module organization is carried forward in examples below, alternative synchronizer module organization may be implemented in other embodiments (e.g., synchronizer module per control signal category: RX, TX, ODT; single shared synchronizer module; etc.). Also, latency controller 101 may generate delayed control and timing signals in response to non-data-forwarding commands such as mode register reads which trigger output of control/status register values at the host interface, "non-target" reads and writes which trigger assertion of ODT or other signals at the host and/or memory interfaces (without corresponding data propagation), etc. Such commands may require no decomposition, but nonetheless be viewed as command-primitives from the perspective of the latency controller.

FIG. 4 illustrates exemplary drift-tracking and synchronizer engines within a more detailed embodiment of the FIG. 1 latency controller 200, the drift-tracking engine (201) to track time-varying (drifting) endpoint delays (δ) and inter-domain phase offset (θ), while the synchronizer engine (203) applies the delay and phase offset values reported by the drift tracker, together with preconfigured latency values ($t_{cfg}$), to delay incoming control signals (i.e., output from the control tile generator in response to corresponding commands from command queue) as necessary to maintain endpoint synchronization. In the depicted implementation, drift-tracker 201 includes δ-tracking circuitry 205 to track run-time-drifting endpoint delays (δ-delay) for the various control signals propagating through synchronizer 203, iteratively updating endpoint delay values (S) supplied to (and applied within) synchronizer 203. Drift tracker 201 may also include θ-tracking circuitry 209 to track run-time timing domain drift (an optional feature that may be omitted or disabled in systems that lack external timing-domain phase alignment circuitry), iteratively updating inter-domain phase offset values (θ) supplied to synchronizer 203 (i.e., storing a phase offset value, θ, within a respective register for each external timing domain tracked by θ-tracker 209). Delay control circuitry 211 receives and optionally stores (e.g., within registers, lookup tables, etc., as discussed below) incoming endpoint delay values (δ), timing-domain phase offset values (θ) and preconfigured latency values ($t_{cfg}$), combining those values to generate respective sync pipe control values ("sp") for the sync pipes within synchronizer modules 212. More specifically, where sync module circuitry 212 implements a synchronizer module per control tile (dedicated-module synchronizer), delay controller 211 outputs respective sync pipe control values for each primary signal within each of I control tiles (i.e., $sp_{i,j}$, where i ranges from 0 to I−1 and j ranges from 0 to J−1, with primary signal count 'J' possibly varying from control tile to control tile). In an alternative embodiment in which sync module circuitry 212 implements a single shared synchronizer module (or a number of synchronizer modules fewer than the number of control-tile types so that one or more of the modules is shared by multiple different control tiles), delay controller 211 may output sync pipe control values for the head-of-queue command only, demuxing control signals at sync pipe outputs onto command-selected signal lines. In both synchronizer-module embodiments—dedicated-module, shared-module—rank-specific sync-pipe control values may be dynamically selected and output by delay controller 211 in response to head-of-queue command-primitives that specify either of two or more memory ranks.

FIG. 5 illustrates a synchronizer embodiment 220 having a distributed-control delay controller 221 together with command-dedicated synchronizer modules 223 (i.e., one synchronizer module 223 for each distinct command-primitive). As shown, the delay controller 221 includes a respective set of sync pipe control circuits 225 for each command-dedicated synchronizer module together with an update arbitrator 227 that ensures glitchless delay parameter updates. In one embodiment, shown in detail view 230, each sync pipe controller 225 includes registers 231, 233 to store endpoint delay and inter-domain phase offset values together with combinatorial circuitry 235 to combine those values and the corresponding preconfigured latency value, $t_{cfg}$ (which may also be locally registered), to produce a sync pipe control value for the corresponding primary control signal (i.e., producing sync pipe control value $sp_{i,j}$, where 'i' is the command-primitive index or control-tile index for the primary control signal, and 'j' is the control signal index). Though not specifically shown, the sync pipe control value may be registered at the output of combinatorial circuit 235—an arrangement that enables a single combinatorial circuit to produce sync pipe control values for respective sets of delay parameters (δ, θ, $t_{cfg}$), with the inputs and outputs of the combinatorial circuit multiplexed/demultiplexed to produce and store respective sync pipe control values (so that registers 231 and/or 233 may be omitted from sync pipe control circuit and/or be located within the tracking circuits shown at 205/209 in FIG. 4). Sync pipe controller 240 may be deployed within delay controller 221 where rank-specific endpoint delay values (i.e., as registered in 231a, 231b) are to be selected. As shown, an index (idx) generated in response to the head-of-queue command primitive is supplied to multiplexer 241 to select between those endpoint delays (though not specifically shown, similar indexing may be applied to select rank-specific inter-domain phase offsets). As in sync pipe controller 230, the output of combinatorial circuit 235 may be registered, enabling omission of input registers 231a, 231b, 233 (i.e., the values therein being registered, for example, within drift tracking circuitry).

Still referring to FIG. 5, each sync pipe 229 within a given synchronizer module 223 includes a phase interpolator 245 together with one or more skip circuits 246a/246b, the latter to implement whole tck delays in response to the α field of the sync pipe control value (with half-tck resolution in one embodiment to ensure setup and hold margins at the retimed skip circuit output) and the former to implement fractional tck delay, generating an output clock ("oclk") that retimes the skip circuit output into the launch-point timing domain (q) and optionally serves as a primary or subordinate control signal. These operations are discussed in further detail below.

FIG. 6 illustrates an alternative synchronizer embodiment 250 having a lookup-based delay controller 251 together with a command-shared synchronizer module 253. In the example shown, delay controller 251 includes a δ lookup table (LUT) 255 to store command-indexed endpoint delay values (δ), a $t_{cfg}$ LUT 256 to store predetermined latency values (i.e., $t_{cfg}$ values loaded during system initialization and/or calibration), and bank of θ registers 257 to store command-indexed inter-domain phase offsets, the δ LUT and θ register bank being updated by the FIG. 4 drift-tracking engine. Delay controller 251 addresses (indexes) δ LUT 255, θ-register bank 257 and a preconfigured-delay LUT 256 in response to commands incoming from command queue 103 (i.e., decoder 217 generating command specific LUT indexes and register-select values, 'i' and 'k') to retrieve, for each set of primary control signals corresponding to a given command-primitive 'i' (i.e., $d_{i,0}$ to $d_{i,J-1}$), corresponding δ-delay, $t_{cfg}$ and domain-phase (θ) values. Control synthesizer 259 combines the delay parameters (δ, θ, $t_{cfg}$) to generate respective sync pipe control values for primary control signals triggered by the subject command—in this example, each sync pipe control value having whole-tck (α) and fractional-tck (θ) delay-control fields corresponding to the α, φ values shown in FIGS. 2 and 3. The sync pipe control values are applied, in turn, within shared sync module 253 to yield precisely and individually delayed output instances ($q_{i,0}$–$q_{i,J-1}$) of control-tile input signals ($d_{i,0}$–$d_{i,J-1}$). Demultiplexer 261, an element that may form part of the endpoint propagation delay (and thus have a compensated propagation delay), routes the command-specific control signals to the command-specific signal lines and thus to command-specific endpoint control destinations.

In the FIG. 4-6 embodiments, δ-tracker 205 iteratively generates estimates of endpoint delays for respective control signals independently of commands and control tiles supplied to synchronizer 203, updating the S storage structures (registers 231 in the FIG. 5 synchronizer, δ lookup table 255 in the FIG. 6 synchronizer) without disrupting through-synchronizer control-signal flow. More specifically, in contrast to "in-band" drift-tracking approaches that implement a respective locked-loop drift-compensation circuit as part of delay-path for each control signal (with the locked-loop drift-compensation circuit supplying timing signals for propagating the control signal through successive register/latch stages of the controlled-delay path), δ-tracker 205 operates outside the control-signal delay path ("out-of-band" implementation separate from the delay path) and supplies no clocks or other timing signals to the delay path—a traffic dissociation that enables δ-tracker 205 to operate on a schedule entirely independent of commands streaming into the data buffer IC so that (i) individual δ-delays may be sequentially ascertained and updated using a shared locked-loop phase comparator circuit, dramatically lowering power consumption relative to in-band implementations that require a locked-loop comparator per drift-compensated endpoint delay and (ii) all δ-delays may be updated at deterministic, nominally regular intervals regardless of the incoming command sequence—avoiding unnecessarily frequent updates (and concomitant power consumption) and also avoiding prolonged uncompensated δ drift due to dearth of particular command type and/or need for dummy command insertion to prevent such uncompensated drift scenario.

FIG. 7 illustrates exemplary and parallel δ-delay tracking and θ-tracking operations (265, 266) implemented within the δ-tracker and θ-tracker of FIG. 4, respectively. In δ-tracker operation 265, a command-primitive index 'i' and primary control signal index 'j' (per notation described above) are reset at 267, followed by δ-delay measurement and δ storage update at 268 for each primary signal j (inner loop implemented by increment and compare operations at 269, 270) of each distinct command-primitive i (outer loop implemented by increment and compare operations at 271, 272), iteratively re-executing the inner- and outer-index loops to produce, at regular intervals and independently of the incoming command stream, δ-delay measurement and δ register/LUT update for each drift-tracked endpoint delay, δ. In one embodiment, each distinct endpoint delay measurement at 268 is executed with respect to interconnected circuit elements that model the event-alignment endpoint delay for the corresponding control signal—that is, measurement of propagation delay through replica circuitry subject to nominally the same instantaneous temperature and voltage as counterpart in-path circuitry and thus exhibiting end-to-end propagation delay (replica δ) substantially identical to that of the in-path circuitry. In effect, the replica delay tracking constitutes a modeled-circuit estimation of in-path circuit delays (i.e., actual end-point propagation delay) that accounts for time-varying temperature and voltage within replica circuitry nominally having the same process characteristics as the in-path circuitry (i.e., PVT-matched or nominally matched delay).

In contrast to regularly-scheduled replica delay measurement and update (i.e., iteratively measuring replica delay, δ[i,j], for all values of command and primary-signal indices i and j at internally controlled/programmed intervals), inter-domain phase offset tracking at 266 may be implemented opportunistically, during intervals when externally sourced strobe signals are received within the data buffer (or during other intervals such as dedicated training intervals determined by the host controller). In one embodiment, for example, phase comparisons between the internal clock (Clk) and incoming strobe signals (i.e., host strobe signal DQS and memory strobe signals from respective ranks, MDSQ0, MDSQ1, etc.) are carried out whenever those strobe signals are actively toggling (i.e., at intervals indicated by the incoming command stream), with the phase lead/lag determinations applied to update phase offset values (θ) maintained within command-indexed θ LUT or register bank. Also, in some embodiments, phase comparisons may be performed in external devices with measurement results and/or corresponding control adjustment communicated to the θ tracker.

FIG. 8 illustrates exemplary generation of delay-path controls (sync-pipe control values) for command-triggered control signals, starting at 281 by retrieving latency parameters (δ, θ, $t_{cfg}$) for each component signal 'j' of the control tile for the head-of-queue command 'i' from respective storage sources—an optional operation executed, for example, in the LUT-indexed delay controller of FIG. 6 and unnecessary in the command-dedicated delay controller of FIG. 5. More specifically, decoder/index generator 262 within the FIG. 6 delay controller produces LUT index 'i' and θ-domain index 'k' in response to the head-of-queue command, and applies those indices to LUTs 255/256 and register bank 257, respectively, to obtain, for each control signal 'j', end-point delay value δ[j], pre-configured latency value $t_{cfg}$ and domain-phase offset θ[j]. By contrast, delay control parameters may be pre-stored in the delay controller of FIG. 5 (e.g., within registers 231, 233), obviating command-prompted parameter retrieval except for possible rank-specific parameter selection (e.g., via multiplexer 241 of FIG. 5). At 283, the delay controller (e.g., element 211 of FIG. 4) combines the indexed latency parameters (δ[j], $t_{cfg}$[j], θ[j]) to produce a net sync-pipe latency value (sp[j]) for each primary control signal 'j'—the combination in this case being a sum of the pre-configured latency and inter-domain phase offset less the endpoint propagation delay (i.e., θ[j]+$t_{cfg}$[j]−δ[j]). Extraction of coarse and fine sync-pipe control values (α and θ) from the net sync pipe control value is shown at 285, where a is the number of whole tck delay steps and φ represents an inter-cycle (fractional tck) phase delay between 0 and 360°. The depicted extraction may be conceptual only (no explicit operation required) where the α and φ values are constituted by respective, contiguous bit fields within the sync pipe control value (e.g., most significant M bits of sync pipe control value constitute a, and least significant N bits of that value constitute ϕ).

FIG. 9 illustrates an embodiment of a run-time δ-tracking engine that may implement delay-tracking engine 205 of FIG. 4. In the depicted example, a delay locked loop (DLL) formed by selectable-delay block 301, phase detector 303, measurement controller 305 and phase interpolator 307 iteratively adjusts a phase code (ph-code$_{OM}$[i,j]) supplied to the interpolator to align the phase of a measurement clock (clk$_{OM}$) with the phase of an endpoint delay clock (clk$_δ$), the latter being an instance of device clock (Clk) phase-delayed by the propagation delay of a selected replica delay 311 within delay block 301. More specifically, as shown in the operation flow at 320, measurement controller 305 retrieves/selects an endpoint propagation delay value corresponding to primary control signal 'j' and command-primitive 'i' from the δ storage structure at 321 (i.e., reading the S entry from a lookup table or selecting a register specified by address field, δ-sel [i,j]) and outputs a corresponding phase code ph-code$_{OM}$[i,j] to phase interpolator 307 (the phase-code being derived from or an exact instance of the δ-delay). Phase interpolator 307 generates clk$_{OM}$ with a phase according to the phase code, for example, by selecting a neighboring pair of eight incoming device-clock phases pclk[7:0]-clock phases evenly distributed at n*45° within a Clk cycle, where n=0 to 7— and generating, as clk$_{OM}$, a weighted combination of those clock phases. Phase detector 303 compares clk$_{OM}$ with clk$_δ$ to yield, for example, a binary phase lead/lag indication of which clock leads the other (i.e., in a bang-bang phase detector implementation) or a proportional phase error value indicating the direction and magnitude of any phase offset between the two clocks (proportional phase detector implementation). In the binary lead/lag case, measurement controller 305 increments or decrements the phase code according to the determination at 323 as shown by the alternate operations at 325 and 327 (corresponding proportional phase code adjustments may be implemented in response to a proportional phase error), followed by updating the endpoint delay (according to the phase code adjustment) and storing the updated value within the S store (e.g., register or LUT) at 329, and then modulo-incrementing the inner/outer loop indices at 331.

In one embodiment, measurement controller 305 cycles round-robin through the replica delays 311 (i.e., S-replica [i,j] within selectable-delay block 301) and corresponding phase codes, ph-code$_{OM}$[i,j] (e.g., outer loop index i incremented for each command-primitive, inner loop index j incremented for each primary control signal corresponding to that command primitive), so that the clk$_δ$ phase corresponding to each replica delay is compared with the corresponding measurement clock phase (clk$_{OM}$) for that replica delay once per full measurement loop (i.e., the measurement loop represented by return to index-reset similar to that shown at 267 in FIG. 7). Through this operation, all replica delays are measured (yielding circuit-modeled estimates of corresponding endpoint propagation delays) within a single locked-loop circuit—a delay-locked loop (DLL) in the FIG. 9 example—regardless of commands (quantity or type) streamed into the data buffer IC during the measurement loop (i.e., delay measurements captured for all δ-replicas corresponding to command i during a given interval even if no instance of command i are received during that interval) and with a regularity (measurement frequency/schedule) set by the measurement controller 305. In alternative embodiments, two or more locked-loop measurement circuits may be provided to cyclically update endpoint delay measurements for respective sub-groups of replica delays and, in the extreme, a dedicated locked-loop measurement circuit may be provided for each replica delay (e.g., I*J DLLs). All such arrangements, including locked-loop measurement circuit per replica delay, enable traffic-dissociated/command-stream-independent measurement scheduling in which each delay measurement may be, for example, executed at a much lower frequency than the peak rate at which the corresponding command may be received—that is, replica delay measurement frequency may be set to a programmable or pre-set time interval (t$_{meas}$) sufficient to track worst-case and relatively slow PVT phase drift where t$_{meas}$ exceeds the command-to-command interval (inverse of peak command rate) by one or more orders of magnitude.

In one embodiment, the FIG. 9 measurement controller outputs load/store instructions and address values ("ld/str" and δ-sel[i,j]) to read and write endpoint delays from/to the FIG. 5 endpoint-delay registers (e.g., 231) or FIG. 6 δ-LUT prior to and after each δ-delay measurement/update cycle, and more specifically may write a filtered version of the instantaneous phase-code$_{OM}$[i,j] back to the δ-store (e.g., implementing an infinite or finite impulse response (IIR, FIR) filter using the table-retrieved δ[i,j] value as a weighted historical value with which the instantaneous phase code measurement ph-code$_{OM}$[i,j] is combined to produce an updated instance of δ[i,j]). Arbitration logic may be provided within measurement controller 305 or as a front-end access manager for a synchronizer-resident δ registers or δ LUT to avoid glitching sync pipe control value generation during δ register/δ LUT update. In the command-dedicated synchronizer of FIG. 5, for example, a double-buffered register set may be used to implement the δ store (i.e., one register pair for each of, say, four to eight replica delays corresponding to respective control signals) with one set of registers containing the values subject to update by measurement controller 305 and the other set of registers containing values supplied to respective sync pipes, alternating the roles of those register sets at strategic intervals (e.g., every $N^{th}$ Clk edge and/or during an idle interval corresponding to lack of traffic, bus-turnaround delay, etc.).

FIG. 10 illustrates an exemplary implementation of FIG. 9 measurement controller 305. As shown, a finite state machine 335 (or sequencer or processor or other control circuitry) generates a delay-select value (i.e., δ-sel[i,j], used to select a replica delay within selectable-delay block 301 of FIG. 9 and to select a S register or LUT entry within the synchronizer for δ[i,j] update as discussed above) and, during synchronizer update, a store-enable signal, "str." The delay-select value is applied to demultiplexing/multiplexing circuits 337, 338 to select one of I*J endpoint delay registers 339 (where I is the number of command-primitives and J is the number of primary control signals per command-primitive—a number that may vary from one command-primitive to the next) to drive the delay control (δ[i,j]) under measurement and/or to be updated. The selected delay control value is output from the measurement controller (for storage within the synchronizer) and supplied to phase code logic 340, the latter to produce the phase code (ph-code$_{OM}$[i,j]) delivered to the OutMeas phase interpolator. In the depicted embodiment, the phase update value (ph±) returned from the phase detector (i.e., element PD 303 within the FIG. 9 OutMeas circuit is supplied to finite state machine 335 which, in turn, selectively drives phase-up and phase-down signals ("up"/"dn") that are routed (via demultiplexer 337) to respective increment/decrement inputs of the selected S register 339. In alternative embodiments, a proportional phase-change value (having both magnitude and direction) may be added to/subtracted from the selected δ register content (i.e., as opposed to fixed-increment up/down). Also, though not specifically shown, filtering circuitry (e.g., FIR, IIR) may be implemented within state machine 335 or elsewhere within the FIG. 10 measurement controller to yield a filtered δ-register update in response to a bang-bang or proportional phase-detect value (ph±). Additionally, as discussed in reference to FIG. 9, the depicted set of S registers 339 may form the first of two S register sets, with (i) the second register set being applied within the counterpart synchronizer, and (ii) circuitry provided to alternate the roles of the two register sets between synchronizer-application and δ-tracker application (updating the first register set within the δ-tracker while the second register set is applied to produce pipe control values within the synchronizer and then strategically swapping one set for the other—swapping all registers at once, per command-primitive, or per register update). FIG. 11 illustrates an alternative measurement controller embodiment having a single δ register 345 that is loaded with a given end point delay value (finite state machine 347 asserting load signal "ld" to retrieve δ value from storage structure within synchronizer) and then adjusted as discussed in reference to FIG. 10.

FIG. 12 illustrates an alternative LUT-based synchronizer embodiment 360 having a command decoder/index generator 361, $t_{cfg}$ LUT 363, δ LUT 365, θ register bank 367, phase controller 369 and synchronizer modules 371. In the depicted example, decoder 361 outputs a command index 'i' and domain-selection value 'k' in response to each head-of-queue command (or command-primitive). The command index is applied to $t_{cfg}$ LUT 363 and δ LUT 365 and to retrieve respective sets of pre-configured latency values and endpoint delay values (e.g., as shown at 373 and 375, respectively), while the domain-selector retrieves (e.g., from a selected one of registers 377 via multiplexer 379) a respective phase offset value θ according to the reference timing domain (index k)—including a 0° phase offset for commands that trigger Clk-referenced endpoint-event alignment.

In the FIG. 12 example, the number of primary control signals propagating through synchronizer 360 in response to each command-primitive (i.e., number of primary control signals 'J' that constitute a given control tile) is assumed, for purposes of explanation, to be less than or equal to four. Accordingly, respective sets of four endpoint delay values and four pre-configured latency values are retrieved from LUTs 363, 365 and supplied to phase controller 369 for each incoming command (i.e., as shown at 373, 375), with any number of those values being unused (null signals) for command-primitives having fewer than four primary control signals. Similarly, the control signals generated in response to each command-primitive are assumed to be endpoint aligned to the same timing domain so that only one θ value need be retrieved for all four control signals. In alternative embodiments, the number of supported primary control signals may exceed four (e.g., with tables 363 and 365 containing, for example, null values or disable codes stored in unused entries indexed by a given command-primitive) and/or multiple θ values may be supplied to phase controller 369 (e.g., retrieved from a two-dimensional structure like LUTs 363, 365) where individual control-tile signals require endpoint-event alignment with respect to different timing domains.

Continuing with the FIG. 12 embodiment, phase controller 369 arithmetically combines the preconfigured latency ($t_{cfg}$), timing domain phase offset (θ) and endpoint delay (δ) values retrieved for respective incoming control signals (d[3:0])—specifically, subtracting the endpoint delay (δ) from a sum of the preconfigured latency and timing domain phase offset ($t_{cfg}$+θ)—to producing corresponding sync pipe control values (sp[3:0]), each having digital α and φ component fields. The sync pipe control values are supplied to synchronizer modules 371, one of which is enabled (e.g., by decoding the command-primitive index (381) into a one-hot value that enables the specific synchronizer module for the corresponding control tile and thus effecting the demultiplexing operation shown at 261 in FIG. 6) to launch corresponding delayed instances q[3:0] of the incoming primary control signals d[3:0] in accordance with respective sync pipe control values sp[3:0]. In alternative embodiments, rather than selecting a distinct synchronizer module per control-tile, input signals (d) may be multiplexed into and out of one or more shared synchronizer modules (e.g., as discussed in reference to FIG. 6) so that a separate synchronizer module need not be provided for each of 'I' possible command primitives.

FIG. 13 illustrates an embodiment of a multi-cycle skip circuit 400 that may be deployed within the various sync pipes discussed above (e.g., to implement skip circuit 246a and/or 246b within sync pipe 229 of FIG. 5). In the depicted example, multi-cycle skip circuit 400 indexes a skip-control lookup table 401 using the sync pipe control value (sp), applying both the whole-tck and fractional-tck fields thereof (α and φ) to retrieve, according to delay range implicated by those components, a 5-bit skip-select code ("sel[4:0]") that establishes one of eight half-tck "skip" delays (0*tck to 3.5*tck), alternating between rising-edge (edge+) and falling-edge (edge−) skip-delay paths 403, 405 across the skip-delay progression. By this arrangement, one of the two skip-delay paths 403 or 405 is unused for any given skip delay and thus may be adjusted (selecting a different one of the 0 to 3 whole-tck delays implemented by the chain of flops F1, F2, F3 via multiplexer 407 or 409, as the case may be) to make ready for path switchover (i.e., switching from edge+path 403 to the edge− path 405 or vice-versa via skip-path multiplexer 411). In one implementation, skip-control LUT 401 encodes a path switchover progression and inactive-path "make-ready" selection as shown in FIG. 14, generating a 5-bit skip-selection code (sel[4:0]) in which the most significant bit (sel[4]) selects either the edge+ or edge− skip delay path via skip-path multiplexer 411, while the two pairs of less significant control-code bits (sel[1:0] and sel [3:2]) select one of the four whole-tck delays (yielding skip delays of 0, 1, 2 or 3 tck when the edge+path is selected, and skip delays of 0.5, 1.5, 2.5 and 3.5 tck when edge− path is selected, with the 0.5 tck offset achieved by negative-edge triggered latch element LF within edge− path 405). The active whole-tck delay selection bit pair (sel[3:2] or sel[1:0]) is shaded in FIG. 14 to emphasize the non-disruptive transition in the corresponding unused bit pair. For example, while bits sel[3:2] are applied to control the whole-tck delay through edge− multiplexer 409, edge+control-code bits sel [1:0] may be transitioned between values (i.e., 00↔01, 01↔10, 10↔11) without impacting control signal propagation delay, and more specifically transitioning between values according to whether the phase code indicates an output clock phase in the upper or lower quarter-tck intervals of the relevant 0.5 tck delay interval within the FIG. 14 progression. More specifically, for a sync pipe control value that specifies a delay greater than or equal to 0 tck and less than 0.75 tck, a zero skip delay will be selected via rising-edge path 403—that is, sel[4] is set to '0' and sel[1:0] is set to '00' to pass (via '0' input of multiplexer 407, flop stage FR, and skip-path mux 411) the input signal 'd' at the input of flop F1 to oclk-timed output flop, FO. Throughout that delay range (0.00 tck≤sp<0.75 tck), phase interpolator (e.g., element 245 within the exemplary sync pipe shown in FIG. 5) generates an output clock having a phase offset according to the least significant bits (φ) of the sync pipe control value, with that output clock serving to retime the output of flop stage FO with the specified phase, thus delaying output signal q relative to input signal d by the time interval specified by the sync pipe control value. For a sync pipe control value greater than or equal to 0.75 tck, but less than 1.0 tck, a 0.5 skip delay is selected via edge– skip path 405, freeing edge+path 403 for update/transition. As shown in the FIG. 14 table, for the quarter-tck phase from 0.75 tck to 1.00 tck (nearer the briefer sync-pipe delay setting), the edge+ control code is maintained at sel[1:0]='00' to select the 0 tck delay. By contrast, as the delay specified by the sync pipe control value progresses into the quarter-tck between 1.00 and 1.25 tck, the skip circuit transitions the unselected edge+control code to '01' to select the 1 tck delay—a non-disruptive (glitchless) transition that occurs within the center-point of the delay range over which the edge+skip path is unused. Similar glitchless transitions occur in the unused skip path (403/405) throughout the sync pipe control value progression across the selectable delay range. Note that the output clock phase at the extreme end of the latency control range (i.e., 4.5 tck in this example) is shown as 1.5 tck—a value of 0.5 tck in actuality as the phase code rolls over to zero at the full cycle delay point. FIG. 15 illustrates exemplary bit transitions skip-select code (sel[4:0]) across a 4.5 tck range of sync pipe control values. As shown, bit-state transition occurs within the unused path-selection bit pair (sel[3:2] or sel[1:0]) at the midpoint of the phase range over which the other path-selection bit pair is applied. Other phase steps and path-selection code transition points may be implemented in alternative embodiments.

FIG. 16 illustrates exemplary signal waveforms within the glitchless multi-cycle skip circuit of FIGS. 13-15. As shown, signal state 'A' (conveyed via primary signal line d) is clocked into flop stage F1 at Clk edge 461 and thus presented at the output of that flop stage (i.e., as signal dl) for the ensuing tck interval. Assuming both the edge+ and edge– multiplexers (437, 439) are set to select the dl input (i.e., sel[1:0]=sel[3:2]='10'), then signal state 'A' will appear at the rising-edge input (pr) of multiplexer 441 at the start of clock edge 463 (one cycle delayed from edge 461 due to propagation through flop stage FR) as shown at 465 and at the falling-edge input (pf) of multiplexer 441 a half-tck interval later, at the start of the ensuing falling clock edge (due to propagation through flop stage FF and falling-edge latch LF) as shown at 467. Assuming the sync pipe control value specifies an output clock phase at Clk edge plus 0.75 tck, and ignoring (for the moment) asynchronous delay sources within the skip circuit itself, the output clock is aligned in the selection midpoint between FIG. 14 table entries 4 and 5 (shaded). As the sync pipe control value drops (below 1.75 tck), the skip circuit will transition multiplexer 441 from the edge– path selection (pf) to the edge+edge selection (i.e., toggling sel[4] to transition from the control code shown in FIG. 14 table entry 5 to that shown in table entry 4) and, conversely, as a sync pipe control value rises to 1.75 tck, the skip circuit will transition multiplexer 441 from the edge– path selection to the edge+selection. In either direction (from edge+ to edge– or vice-versa), the transition occurs with a quarter-tck margin (0.25 tck holdtime upon transition to the edge+path, 0.25 tck setup time upon transition to the edge– path) to ensure reliable signal retiming at output flop FO.

Figure 17:
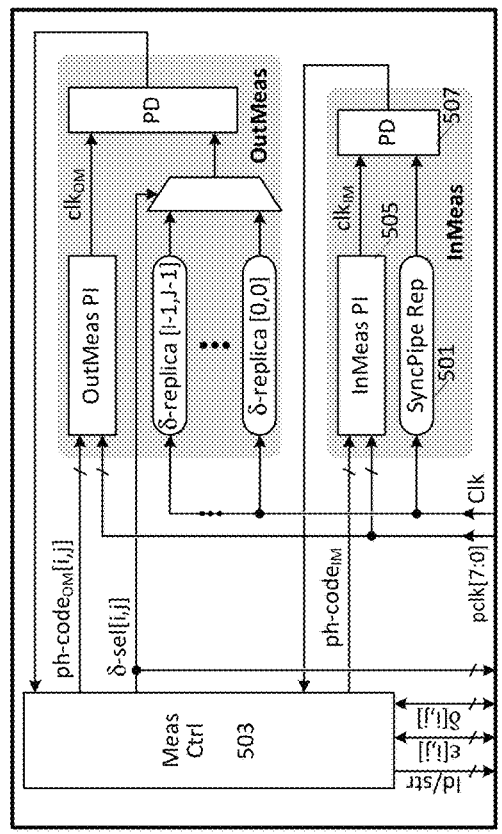
FIG. 17 illustrates an alternative δ-tracking embodiment that iteratively measures a replica delay corresponding to asynchronous delays within synchronizer-internal circuitry and outputs that internal delay measurement together with the endpoint propagation delay (δ) recorded for each control signal.

Returning briefly to FIG. 13, asynchronous delays between the internal clock and output of path-select multiplexer (e.g., clock-to-q delay within flop stage FR, clock-to-q delay latch element LF, propagation delay through multiplexer 441—shown respectively as $tcq_{FR}$, $tcq_{LF}$ and $td_{MP}$ in FIG. 16) may imbalance the path switchover timing, for example, skewing the switchover point at 471 and thus shrinking critical setup time and/or hold-time margins. In a number of embodiments, the device clock signal is gated at the input of each skip circuit (e.g., to selectively disable skip circuits and/or other sync module circuitry within all but the sync module selected for propagation delay control with respect to a given control tile) and possibly buffered (e.g., in a clock-tree structure) to meet fan-out requirements—operations that add further asynchronous delay between Clk edges and the output of path-select multiplexer 411. FIG. 17 illustrates an alternative δ-tracking embodiment that iteratively measures a replica delay corresponding to asynchronous sync pipe delays and outputs that "internal" delay measurement ("InMeas") in association with the corresponding endpoint-delay value generated for each sync pipe, thus providing both the endpoint delay value δ[i,j] and a sync-pipe-internal compensation value ε[i,j] to the synchronizer. In the embodiment shown, an additional "InMeas" DLL is provided to measure propagation delay through a sync-pipe replica element 501 that models the asynchronous delay sources within the sync pipe implementations. As with the OutMeas DLL, a measurement controller 503 iteratively updates a phase code ($ph\text{-}code_{IM}$) to produce (via phase interpolator 505) a measurement clock ($clk_{IM}$) aligned with a sync-pipe-replica-delayed instance of Clk—increasing and decreasing $ph\text{-}code_{IM}$ according to output of phase detector 507. As any asynchronous delay within a given sync pipe delays the timing of signal 'p' at the output of multiplexer 411 (i.e., within a multi-cycle skip circuit 400 of FIG. 13) relative to the output clock (oclk) phase, the sync-pipe-internal compensation value (ε[i,j]) is subtracted from the sync pipe control value "sp" to yield the lookup index applied to the skip-control LUT (i.e., element 401 of FIG. 13), thus looking up a "sel[4:0]" value that nominally optimizes setup and hold margin in the output flop "FO." The output clock phase is still derived directly from the unmodified sync pipe control value (i.e., without subtracting ε[i,j]) so that the net delay imposed by the sync pipe relative to Clk is unchanged by the sync-pipe-replica measurement, but internal skip circuit timing margin is optimized. In one embodiment, the sync pipe replica delay measurement is executed once per full cycle through the δ-replica delays (obtained by measuring replica delays δ-replica[0,0] through δ-replica[I−1, J−1]) so that the sync pipe replica delay is measured at the same frequency as each individual one of the δ-replica delays (non-uniform measurement rates may also be implemented, measuring the sync pipe replica delay more or less frequently than δ-replica delays). In those and other embodiments, the sync pipe replica delay may be measured using the same phase detector and phase interpolator as the δ-replica delays, obviating the second DLL instance (i.e., adding delay element 501 as a selectable element within the OutMeas DLL, obviating PI 505 and PD 507).

Figure 18:
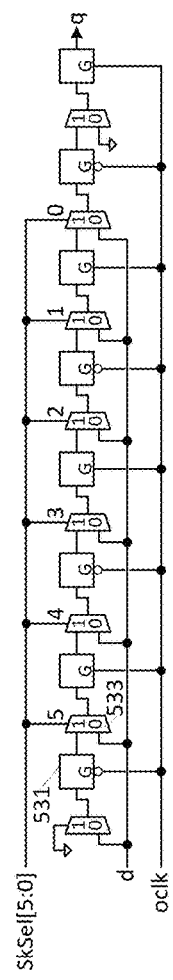
FIG. 18 illustrates an alternative multi-cycle skip circuit embodiment.

FIG. 18 illustrates an alternative multi-cycle skip circuit embodiment having chain of latches 531 timed with alternating output clock polarity (e.g., output clock from the phase interpolator 421 shown in FIG. 5). Each latch 531 is preceded by a 2:1 mux 533 for selection of the data insertion point in the chain. The multi-bit mux select is thermometer-coded, such that the insertion point can only change by one latch position at a time. In one embodiment, multiplexers 533 are implemented by gate-isolated transistors to keep the data input load independent of the mux select setting. The skip circuit receives a control signal (d) from the device clock domain and delivers a delayed control-signal instance (q) in the output clock domain. Different flop chain lengths (and corresponding skip-select bit depths) may be deployed within a given sync pipe implementation according to the delay range required for the corresponding control signal.

The various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the bit-depths (of phase codes, selection codes, control codes, interface widths, etc.), numbers of DQ lines per DQS, numbers of MDQ lines per MDQS, numbers/types of commands, control tiles, numbers of synchronization modules or constituent sync pipes, lookup table sizes or organizations, delay granularities, etc. can be different from those described above in alternative embodiments. Additionally, links or other interconnection between integrated circuit devices or internal circuit elements or blocks may be shown as buses or as single signal lines. Each of the buses can alternatively be a single signal line (e.g., with digital or analog signals time-multiplexed thereon), and each of the single signal lines can alternatively be a bus. Signals and signaling links, however shown or described, can be single-ended or differential. Logic signals/control signals shown as having active-high assertion or "true" states, may have opposite assertion states in alternative implementations. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. An integrated circuit device comprising:
   a command interface to receive a sequence of commands;
   a control signal generator to generate first control signals in response to each of the commands; and
   latency-control circuitry to:
      retime the first control signals in accordance with corresponding delay-control values to produce respective retimed control signals; and
      iteratively update the delay control values independently of the sequence of commands such that all the delay-control values are updated within a given interval irrespective of commands received during that interval.

2. The integrated circuit device of claim 1 wherein the control signal generator to generate the first control signals comprises synchronous circuitry to generate the first control signals in response to a first clock signal within a first timing domain, and wherein the latency-control circuitry to retime the first control signals in accordance with corresponding delay values to produce respective retimed control signals comprises circuitry to assert the retimed control signals in response to a second clock signal within a second timing domain, the second timing domain being phase offset relative to the first timing domain according to one or more of the delay-control values.

3. The integrated circuit device of claim 1 wherein the synchronous circuitry to generate the first control signals in response to the first clock signal comprises circuitry to assert the first control signals at a first transition of the first clock signal, and wherein the circuitry to assert the retimed control signals in response to the second clock signal comprises circuitry to assert one of the retimed control signals in response to a transition of the second clock signal that occurs a specified number of transitions of the first clock signal after the first transition, the specified number of transitions being indicated by one of the delay values corresponding to the one of the retimed control signals.

4. The integrated circuit device of claim 1 wherein the latency-control circuitry to iteratively update the control values independently of the sequence of commands comprises delay-tracking circuitry to estimate, on a round-robin schedule that is independent of the sequence of commands, respective propagation delays to be specified by the delay control values.

5. The integrated circuit device of claim 4 wherein the delay-tracking circuitry to estimate respective propagation delays to be specified by the delay control values comprises circuitry to generate, for each of the delay control values, a measure of propagation delay through a set of circuit elements that models, at least in part, a propagation delay of a signal path traversed by a corresponding one of the retimed signals.

6. The integrated circuit device of claim 5 further comprising a storage circuit, and wherein the latency-control circuitry to iteratively update the control values independently of the sequence of commands comprises storing within the storage circuit, as each of the delay control values, a digital control value based at least in part on the measure of propagation delay.

7. The integrated circuit device of claim 6 wherein the latency-control circuitry to retime the first control signals in accordance with corresponding delay-control values to produce respective retimed control signal comprises circuitry to retrieve the digital control value from the storage circuit in response to reception of a command that requires production of a corresponding one of the retimed control signals.

8. The integrated circuit device of claim 5 wherein the delay-tracking circuitry to estimate respective propagation delays to be specified by the delay control values further comprises circuitry to iteratively estimate, on a schedule independent of the sequence of commands, asynchronous delay within circuitry that produces the retimed control signals, and wherein the latency-control circuitry to iteratively update the delay control values comprises circuitry to store, as each of the delay control values, a digital control value based on both the measure of propagation delay and the estimation of the asynchronous delay within the circuitry that produces the retimed control signals.

9. The integrated circuit device of claim 1 wherein the latency-control circuitry to retime the first control signals in accordance with corresponding delay-control values to produce respective retimed control signals comprises circuitry to alternately select either a first propagation delay path or a second propagation delay path through which one of the first control signals propagates to produce a corresponding one of the retimed control signals.

10. The integrated circuit device of claim 9 wherein the latency-control circuitry further comprises circuitry to reconfigure, while one of the first and second propagation delay paths is selected to conduct the one of the first control signals, the other of the first and second propagation delay paths to alter the propagation delay therethrough without disrupting production of the one of the retimed control signals.

11. A method of operation within an integrated circuit device, the method comprising:
receiving a sequence of commands;
generating first control signals in response to each of the commands;
retiming the first control signals in accordance with corresponding delay-control values to produce respective retimed control signals; and
iteratively updating the delay control values independently of the sequence of commands such that all the delay-control values are updated within a given interval irrespective of commands received during that interval.

12. The method of claim 11 wherein generating the first control signals comprises generating the first control signals in response to a first clock signal within a first timing domain, and retiming the first control signals in accordance with corresponding delay values to produce respective retimed control signals comprises asserting the retimed control signals in response to a second clock signal within a second timing domain, the second timing domain being phase offset relative to the first timing domain according to one or more of the delay-control values.

13. The method of claim 11 wherein:
generating the first control signals in response to the first clock signal comprises asserting the first control signals at a first transition of the first clock signal;
asserting the retimed control signals in response to the second clock signal comprises asserting one of the retimed control signals in response to a transition of the second clock signal that occurs a specified number of transitions of the first clock signal after the first transition, the specified number of transitions being indicated by one of the delay values corresponding to the one of the retimed control signals.

14. The method of claim 11 wherein iteratively updating the control values independently of the sequence of commands comprises estimating, on a round-robin schedule that is independent of the sequence of commands, respective propagation delays to be specified by the delay control values.

15. The method of claim 14 wherein estimating respective propagation delays to be specified by the delay control values comprises generating, for each of the delay control values, a measure of propagation delay through a set of circuit elements that models, at least in part, a propagation delay of a signal path traversed by a corresponding one of the retimed signals.

16. The method of claim 15 wherein iteratively updating the control values independently of the sequence of commands comprises storing, as each of the delay control values, a digital control value based at least in part on the measure of propagation delay.

17. The method of claim 16 wherein storing the digital control value based at least in part on the measure of propagation delay comprises storing the digital control value within a storage circuit, and wherein retiming the first control signals in accordance with corresponding delay-control values to produce respective retimed control signal comprises retrieving the digital control value from the storage circuit in response to reception of a command that requires production of a corresponding one of the retimed control signals.

18. The method of claim 15 wherein estimating respective propagation delays to be specified by the delay control values further comprises iteratively estimating, on a schedule independent of the sequence of commands, asynchronous delay within circuitry that produces the retimed control signals, and wherein iteratively updating the delay control values comprises storing, as each of the delay control values, a digital control value based on both the measure of propagation delay and the estimation of the asynchronous delay within the circuitry that produces the retimed control signals.

19. The method of claim 11 wherein retiming the first control signals in accordance with corresponding delay-control values to produce respective retimed control signals comprises alternately selecting either a first propagation delay path or a second propagation delay path through which one of the first control signals propagates to produce a corresponding one of the retimed control signals.

20. The method of claim 19 further comprising reconfiguring, while one of the first and second propagation delay paths is selected to conduct the one of the first control signals, the other of the first and second propagation delay paths to alter the propagation delay therethrough without disrupting production of the one of the retimed control signals.

21. An integrated circuit device comprising:
a command interface to receive a sequence of commands;
a control signal generator to generate first control signals in response to each of the
means for retiming the first control signals in accordance with corresponding delay-control values to produce respective retimed control signals; and
means for iteratively updating the delay control values independently of the sequence of commands such that all the delay-control values are updated within a given interval irrespective of commands received during that interval.

\* \* \* \* \*